(12) United States Patent
Englhardt

(10) Patent No.: US 8,546,918 B2
(45) Date of Patent: Oct. 1, 2013

(54) SEMICONDUCTOR DEVICE

(71) Applicant: Infineon Technologies AG, Neubiberg (DE)

(72) Inventor: Manfred Englhardt, Villach-Landskron (AU)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/735,851

(22) Filed: Jan. 7, 2013

(65) Prior Publication Data

US 2013/0119517 A1  May 16, 2013

Related U.S. Application Data

(62) Division of application No. 12/820,715, filed on Jun. 22, 2010, now Pat. No. 8,361,884.

(51) Int. Cl.
*H01L 29/06* (2006.01)

(52) U.S. Cl.
USPC .............................. 257/618; 257/656; 438/462

(58) Field of Classification Search
USPC .................. 257/618, 656, E23.179; 438/462
See application file for complete search history.

(56) References Cited

U.S. PATENT DOCUMENTS

| | | | |
|---|---|---|---|
| 4,855,017 A | 8/1989 | Douglas | |
| 4,904,609 A * | 2/1990 | Temple | 438/140 |
| 5,501,893 A | 3/1996 | Laermer et al. | |
| 6,383,937 B1 * | 5/2002 | Tseng | 438/705 |
| 7,012,012 B2 * | 3/2006 | Yeom et al. | 438/462 |
| 7,042,036 B2 | 5/2006 | Chung et al. | |
| 7,728,360 B2 | 6/2010 | Chen et al. | |
| 2004/0227140 A1 | 11/2004 | Lee et al. | |

FOREIGN PATENT DOCUMENTS

DE  43 06 320 B4  8/2004

* cited by examiner

*Primary Examiner* — Phuc Dang
(74) *Attorney, Agent, or Firm* — Slater & Matsil, L.L.P.

(57) ABSTRACT

In one embodiment, a method of forming a semiconductor device includes forming islands by forming deep trenches within scribe lines of a substrate. The islands have a first notch disposed on sidewalls of the islands. A first electrode stack is formed over a top surface of the islands. The back surface of the substrate is thinned to separate the islands. A second electrode stack is formed over a back surface of the islands.

21 Claims, 16 Drawing Sheets

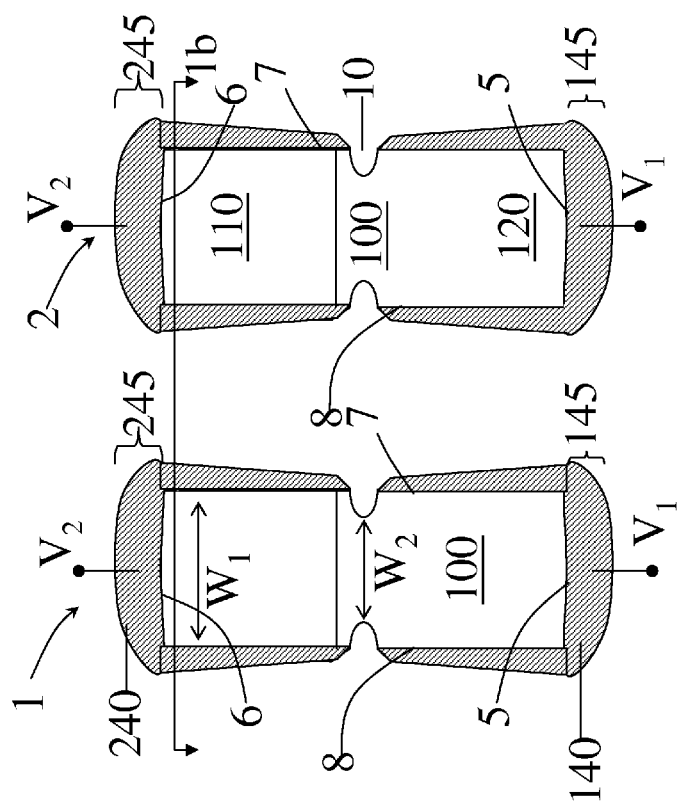
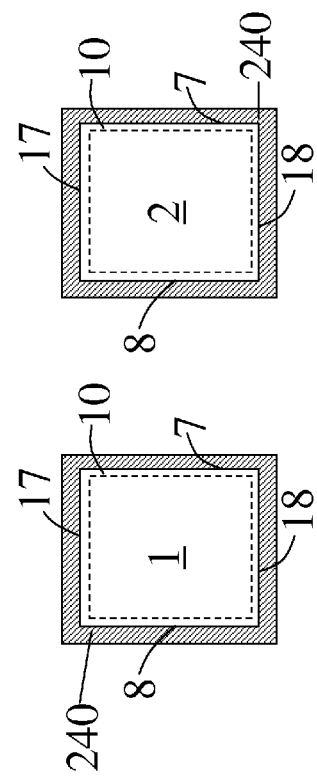
Fig. 1a
Fig. 1b

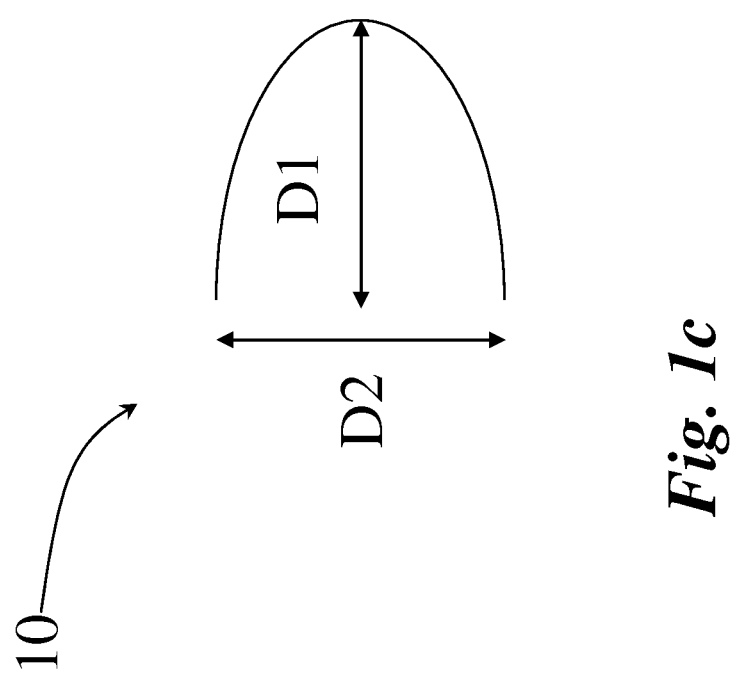

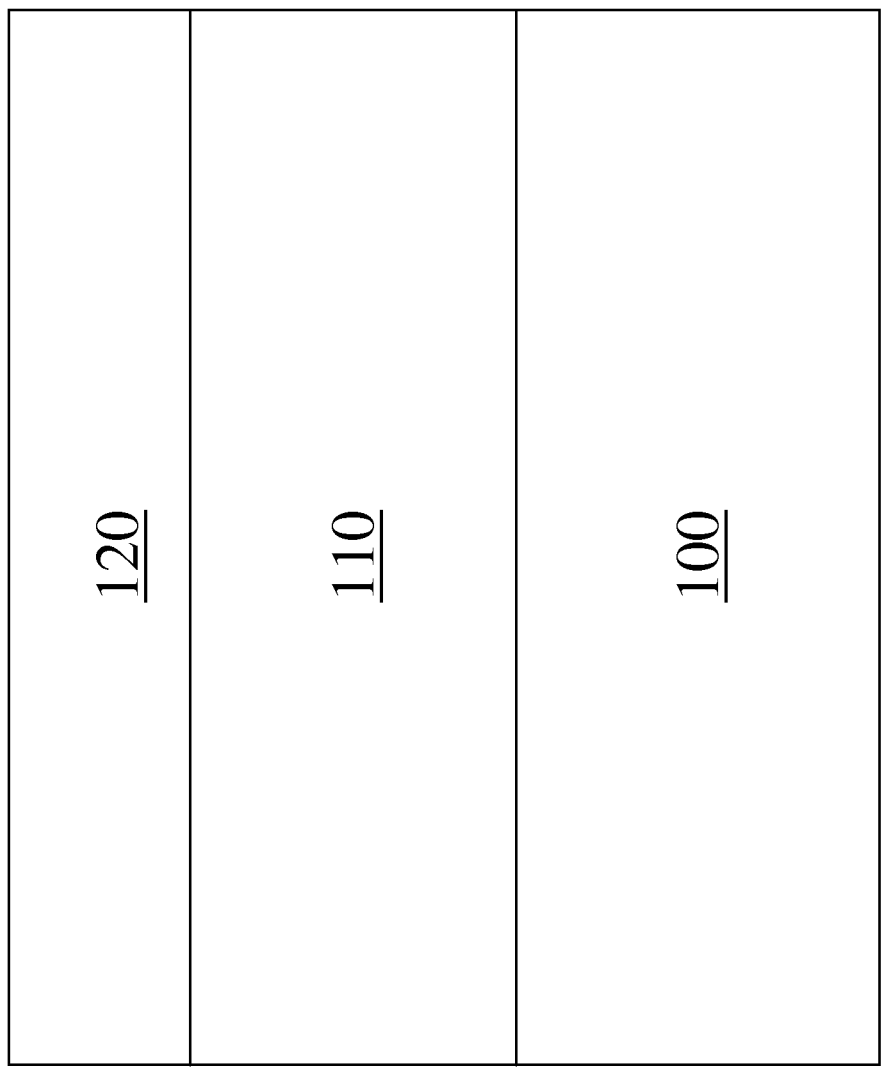

SEMICONDUCTOR DEVICE

This is a divisional application of U.S. application Ser. No. 12/820,715, filed on Jun. 22, 2010, which issued as U.S. Pat. No. 8,361,884 and is incorporated herein by reference.

TECHNICAL FIELD

The present invention relates generally to dicing, and more particularly to plasma dicing and semiconductor devices formed thereof.

BACKGROUND

Semiconductor devices are used in a variety of electronic applications, such as personal computers, cell phones, digital cameras, and other electronic equipment, as examples. Identical semiconductor devices are fabricated in a large substrate or wafer and separated into a plurality of individual units or identical semiconductor devices using dicing. The wafer may also be thinned during or after the dicing process and contacts are formed to couple to the functional units within the semiconductor device.

However, conventional dicing process can result in electrical shorts during subsequent contact formation. Therefore, what are needed in the art are improvements in dicing and contact formation.

SUMMARY OF THE INVENTION

In accordance with an embodiment, a semiconductor device includes a first electrode disposed on a top surface of a substrate. A second electrode is disposed on a bottom surface, which is opposite to the top surface. The substrate has a first dimension at the top surface and the bottom surface, but has a second dimension in a first region between the top and the bottom surfaces. In various embodiments, the second dimension is smaller than the first dimension.

In accordance with an embodiment of the invention, a semiconductor device includes a first doped region disposed adjacent a top surface of a substrate. A first electrode is disposed on the top surface. A second doped region is disposed adjacent a bottom surface, which is opposite to the top surface. A second electrode is disposed on the bottom surface. A first notch is disposed around the sidewalls of the substrate in a first region. The substrate has a first dimension at the top surface and a second dimension in the first region such that the second dimension is smaller than the first dimension.

In one embodiment, a method of forming a semiconductor device includes forming islands by forming deep trenches within scribe lines of a substrate. The islands have a first notch disposed on sidewalls of the islands. A first electrode stack is formed over a top surface of the islands. The back surface of the substrate is thinned to separate the islands. A second electrode stack is formed over a back surface of the islands.

In an alternative embodiment, a method of forming a semiconductor device includes performing a first plurality of cycles to form an upper portion of an island within a scribe line of a substrate. Each cycle of the first plurality of cycles includes a standard etching step followed by a passivation step. The standard etching step of the first plurality of cycles has an etching time less than a first duration. The method further includes performing an etching step having a second duration to form a first notch on the sidewalls of the island. The second duration is chosen to be longer than the first duration. A second plurality of cycles is performed to form a lower portion of the island. Each cycle of the second plurality of cycles has a standard etching step followed by a passivation step. The standard etching step of the second plurality of cycles has an etching time less than the first duration.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1a-1c, illustrates two chips, in accordance with an embodiment of the invention, wherein FIG. 1a illustrates a cross-sectional view, wherein FIG. 1b illustrates a top view, and wherein FIG. 1c illustrates a magnified view of a notch disposed around the chips;

FIG. 2-7 illustrate a method of fabricating the semiconductor device in accordance with an embodiment of the invention;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 3:
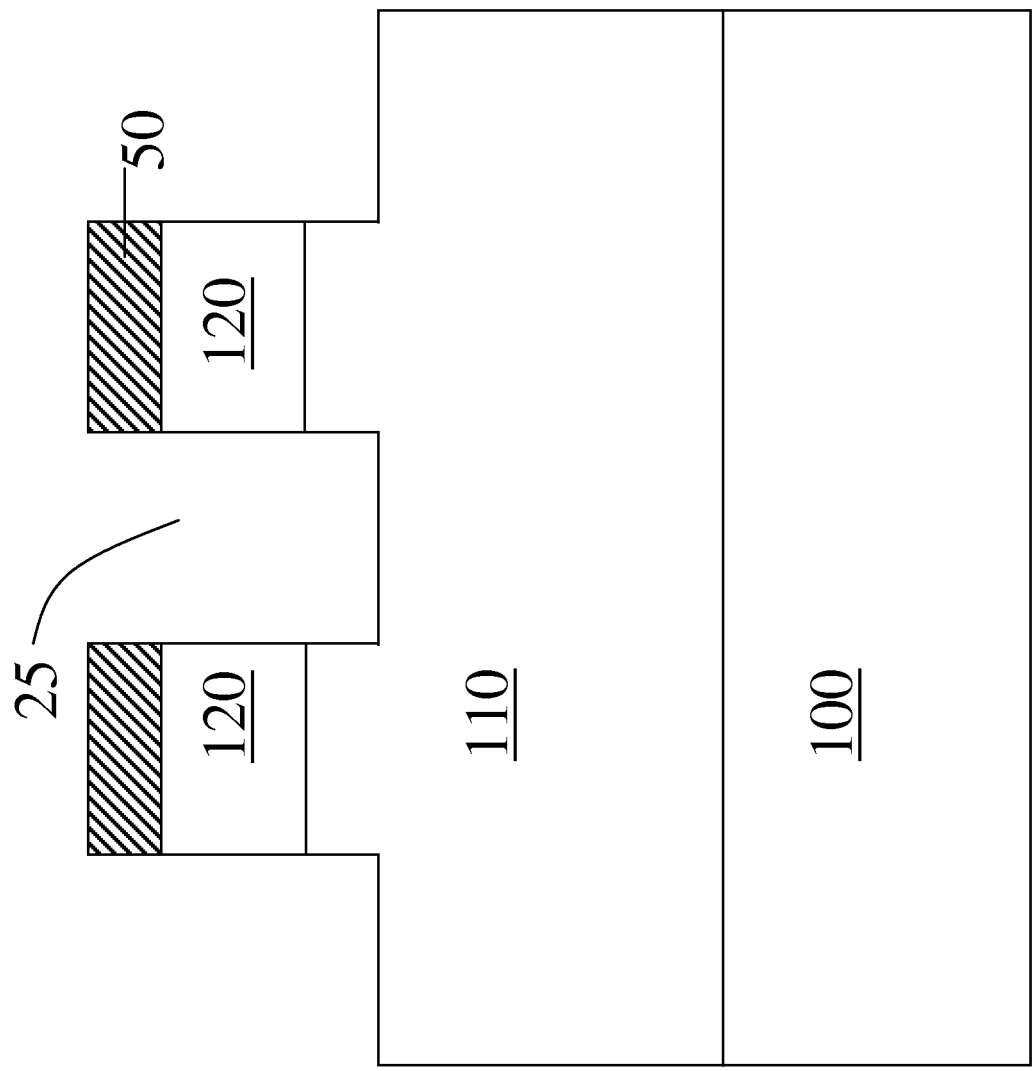

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Plasma processes are being increasingly used for chip separation due to their many advantages. For example, kerf area (also referred as dicing area or scribe lines) may be reduced due to the tighter process control. Similarly, superior mechanical properties may be obtained due to the absence of micro-cracks that are prevalent if mechanical dicing is used.

However, electrical shorting between front side and back side metallization can reduce chip yield thereby negating advantages of using plasma dicing. This is because the plasma process must be performed before the back side contacts are formed. The metal layers formed from the back side may be deposited along the sidewalls of the scribe lines thereby shorting with the front side metallization. In various embodiments, the present invention avoids these and other problems.

A structural embodiment of the invention will be described first using FIG. 1. An embodiment of fabricating the semiconductor device will be described using FIGS. 2-7. FIGS. 8-14 describe further structural and method embodiments of the invention.

FIG. 1, which includes FIGS. 1a-1c, illustrates two chips, a first chip 1 and a second chip 2, in accordance with an embodiment of the invention, wherein FIG. 1a illustrates a cross-sectional view, wherein FIG. 1b illustrates a top view, and wherein FIG. 1c illustrates a magnified view of a notch disposed around the first and the second chips 1 and 2.

Referring to FIG. 1a, the first chip 1 and the second chip 2 having a substrate 100 comprise a first surface 5 and an opposite second surface 6. A first potential node ($V_1$) is coupled to the first surface 5 of the chip 1. A second potential node ($V_2$) is coupled to the second surface 6 of the chip 1.

The first surface 5 of the first and the second chips 1 and 2 are coupled to the first potential node ($V_1$) through a first electrode stack 145 comprising a first conductive layer 140. The second surface 6 of the first and the second chips 1 and 2 are coupled to the second potential node ($V_2$) through a second electrode stack 245 comprising a second conductive layer 240. The first and the second electrode stacks 145 and 245 may comprise a plurality of metal layers in one embodiment.

In one embodiment, the first and the second conductive layers 140 and 240 comprise titanium. In various embodiments, the first and the second conductive layers 140 and 240 comprise tungsten, nickel, cobalt, platinum, silver, gold, copper, aluminum, including metal silicides. In one embodiment, the first and the second conductive layers 140 and 240 comprise the same material. In another embodiment, the first and the second conductive layers 140 and 240 comprise different materials.

The first and the second chips 1 and 2 further comprise a third surface 7 and a fourth surface 8, which are orthogonal to the first and the second surfaces 5 and 6. The third and the fourth surfaces 7 and 8 together with the fifth and the sixth surfaces 17 and 18 form the sides of the first and the second chips 1 and 2 (FIG. 1b).

In various embodiments, the first conductive layer 140 extends over a first portion of the third and the fourth surfaces 7 and 8. As illustrated in FIG. 1a, the first conductive layer 140 extends over a lower part of the third and the fourth surfaces 7 and 8. Similarly, the second conductive layer 240 extends over a second portion of the third and the fourth surfaces 7 and 8. In one embodiment, the second conductive layer 240 extends over an upper part of the third and the fourth surfaces 7 and 8.

In one embodiment, the first and the second chips 1 and 2 comprise a first width ($W_1$) adjacent the first surface 5 and the opposite second surface 6. In a region between the first and the second surfaces 5 and 6, the first and the second chips 1 and 2 comprise a smaller width (second width $W_2$).

Referring to FIG. 1b, the third and the fourth surfaces 7 and 8 together with a fifth surface 17 and a sixth surface 18 form the sides of the first and the second chips 1 and 2. A notch 10 is disposed on sides of the first and the second chips 1 and 2. As illustrated in FIG. 1b, the notch 10 extends around the chips along the third surface 7, the fifth surface 17, the sixth surface 18, and the fourth surface 8.

As illustrated in FIG. 1c, in various embodiments, the notch 10 has a first dimension D1 and a second dimension D2. The first dimension D1 defines a depth (lateral extent) of the notch 10 within the substrate 100, while the second dimension D2 defines the height or length of the notch 10 along the sidewalls. In various embodiments, the first dimension D1 may not be equal on surfaces of the first and the second chips 1 and 2. This may arise due to process differences such as local process variations. Similarly, the second dimension D2 may not be equal on all surfaces (e.g., between surfaces and within any given surface) of the first and the second chips 1 and 2.

In one embodiment, the first and the second chips 1 and 2 are diodes. FIG. 1 illustrates diodes having a first doped region 110 and a second doped region 120. The first doped region 110 has a first doping type, which may be an n-type or a p-type conductivity type. In various embodiments, the second doped region 120 has a second doping type, which is opposite to the first doping type.

In another embodiment, the first and the second chips 1 and 2 are resistors. In yet another embodiment, the first and the second chips 1 and 2 are inductors. In one or more embodiments, the first and the second chips 1 and 2 are capacitors. In alternative embodiments, the first and the second chips 1 and 2 may comprise any device having at least two external contacts.

In various embodiments, the first and the second chips 1 and 2 are configured to be directly soldered to an external circuitry such as a printed circuit board thereby avoiding further packaging. In such embodiments, the first and the second electrode stacks 145 and 245 comprise materials that are amenable to be soldered. Examples include materials such as Nickel-Silver that may be used to form solder joints with printed circuit board. In alternative embodiments, the first and the second electrode stacks comprise Sn—Cu—Ag, Sn—Cu—Ag—Mn, Sn—Cu—Ag—Zn, or one or more combinations of Sb, Pb, Sn, Cu, Ag, Bi, In, Cd, and Au. One or more layers may be deposited during the soldering process itself, or, for example, be part of the printed circuit board.

A method of fabricating the semiconductor device will now be described in accordance with an embodiment of the invention using FIGS. 2-7.

As illustrated in FIG. 2, the device regions are formed within a substrate 100. The substrate may comprise a silicon substrate or suitable semiconductor material including a compound semiconductor. The substrate 100 may also be a silicon on insulator substrate if, for example, a capacitor is being formed.

A first doped region 110 and a second doped region 120 are formed within the substrate 100. The first and the second doped regions 110 and 120 may be formed using ion implantation in one embodiment. The first doped region 110 has a first doping type, which may be an n-type or a p-type conductivity type. In various embodiments, the second doped region 120 has a second doping type opposite to the first doping type.

In one embodiment, the first doped region 110 may be formed by a high energy implant, while the second doped region 120 is formed using a lower energy implant. In one embodiment, high energy implants deliver most of the dopants at least below 50 nm from the surface and below 500 nm in one embodiment thereby forming the first doped region 110. In some embodiments, multiple implants may be performed to produce a constant doping within the first doped region 110. Alternatively, the doping profile in the first doped region 110 may be tailored as needed.

The second doped region 120 may be formed using implants that are lower in energy than the high energy implants. Again, the second doped region 120 may be formed using a plurality of implants to tailor the doping profile within the second doped region 120.

Alternatively, if a resistor is being fabricated, a single region having a same conductivity may be formed. While some embodiments may not implant any dopants into the substrate 100 to obtain a high resistance, in other embodiments, dopants may be introduced to decrease the resistance as well as to improve variations that may be high.

In various embodiments, the substrate 100 may be annealed to diffuse and activate the implanted dopants as well as to remove any damage introduced by the implant.

In some embodiments, the dopants may be introduced using other techniques including epitaxial growth or in-diffusion from solid sources such as borosilicate glass or phosphor silicate glass.

Referring next to FIG. 3, a hard mask layer 50 is deposited over the first surface 5 of the substrate 100. The hard mask layer 50 protects the first surface 5 of the substrate 100 from the plasma during subsequent etching. Therefore, in various embodiments, the hard mask layer 50 is chosen based on the selectivity to the etch process. The hard mask layer 50 comprises a single layer in one embodiment. In other embodiments, a bilayer or tri-layer hard mask layer can be used.

A photo resist layer (not shown) is deposited over the hard mask layer 50. Using photo lithography, the photo resist layer is exposed, developed, and patterned. Using the patterned photo resist layer, the hard mask layer 50 is patterned. The hard mask layer 50 thus patterned exposes the dicing areas or kerf areas between adjacent chips. Alternatively, a patterned resist mask may be used instead of a patterned hard mask A deep reactive-ion etching (DRIE) process is next performed. The DRIE is performed using a Bosch process in one embodiment. The process alternates between the modes of etching and passivation.

During the etching phase, an isotropic etch removes or etches the substrate 100. During the etching step, chemically reactive species and electrically-charged particles (ions) are generated as in a reactive ion etch chamber and accelerated towards the substrate 100. Consequently, the ions impinge almost vertically on the bottom surface of the partially formed trench 25. This avoids further etching of the passivation layer on the sidewall of the partially formed trench 25. Therefore, highly vertical sidewalls can be produced.

In various embodiments, sulfur hexafluoride ($SF_6$) and argon are used as the plasma etch gas because of the highly isotropic etching ability of $SF_6$. In some embodiments, other isotropic etch chemistries such as CF4, $CF_4/O_2$ may also be used.

During the passivation phase, a passivation layer, e.g., a polymer layer is deposited on the sidewalls of the substrate 100 exposed by the previous etching step. The passivation layer protects the exposed sidewalls during the subsequent etching steps and behaves as an etch stop layer. In various embodiments, the surfaces exposed during the previous etching step are covered with a polymer.

The passivation step comprises a polymerization process performed, for example, using a mixture of tri-fluoromethane ($CHF_3$) and argon. After the flow of the etching gas is stopped, the passivation step may be performed introducing $CHF_3$ or a suitable gas (e.g. $C_4F_8$). A person skilled in the art will adjust the gas flows, pressures, and power settings of both RF generators depending on the application (for example, such as on chip dimensions, wafer diameter etc.).

A polymer is formed from the polymerization process. In one embodiment, a Teflon-like polymer is formed on the sidewalls of the partially formed trench 25 during the polymerization process.

Figure 4A:
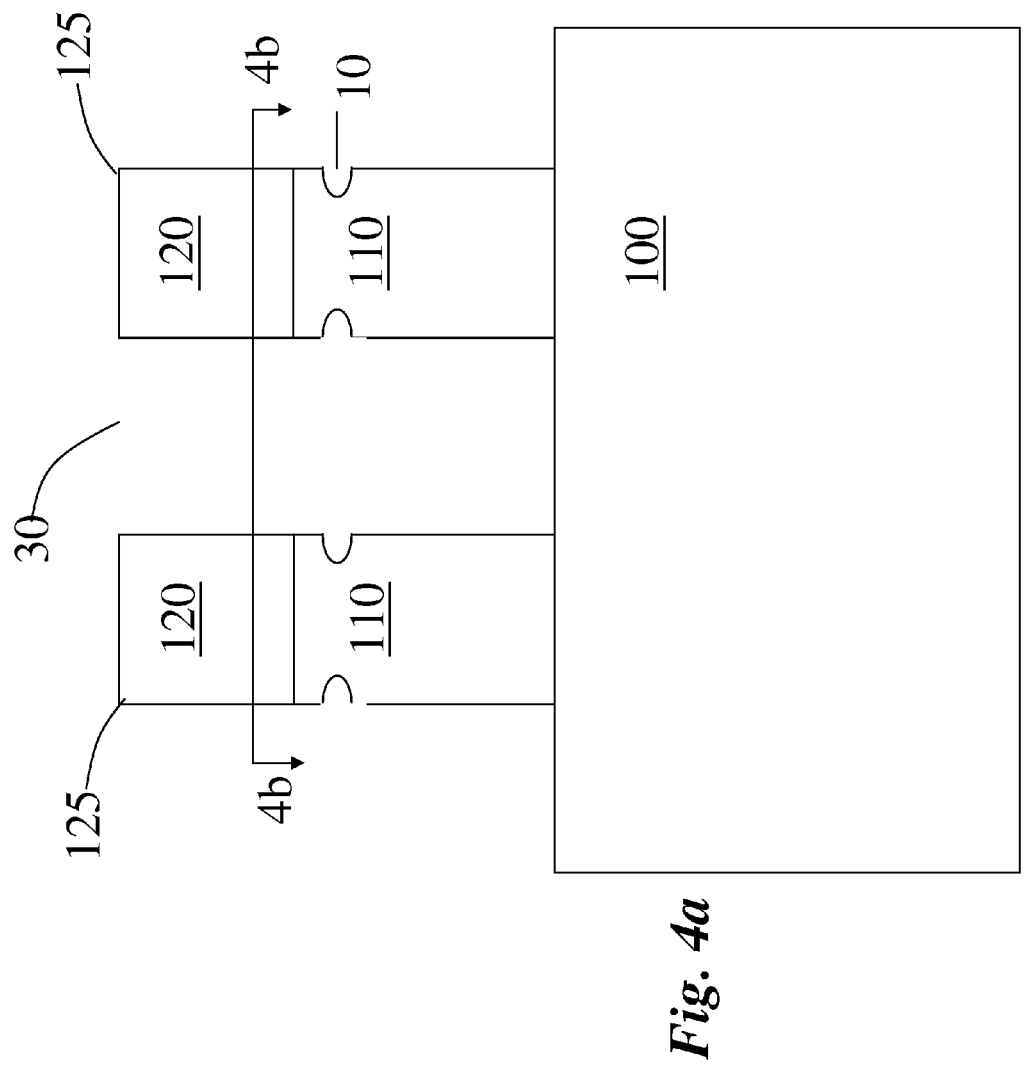

In various embodiments, a cycle comprising the etching and the passivation steps may be repeated many times. This repetition forms a deep trench 30 having vertical sidewalls or almost vertical sidewalls such as slightly tapered sidewalls, as illustrated in FIG. 4*a*. In one embodiment, each etching step is performed for about 1 s to about 10 s followed by a passivation step for about 1 s to about 10 s. In one embodiment, about 100 to about 1000 cycles may be performed to form the deep trench 30. However, in various embodiments, the duration of both the etch and the deposition steps as well as the number of cycles depend on process variables that a person skilled in the art can select, for example, the availability of fast switching mass flow controllers for the process gases may enable faster switching.

In accordance with an embodiment of the invention, after a part of the trench has been formed (e.g. after forming partially formed trench 25 in FIG. 3), one of the etching step is performed for a longer time. In particular, the etching time for this long etching step is higher than the etching times for the other etching steps (normal or standard etching steps). Consequently, the substrate 100 is exposed to the etching chemistry for an additional time due to the long etching time. The additional exposure results in increased lateral etching thereby forming a notch 10.

The location of the long etching step within the etching process may be determined from a predetermined correlation table in various embodiments. The correlation between the etch/passivation steps and the etch rate (or etch depth) determines the location of the long etching step within the deep trench 30. This correlation with etch rate may not be flat or even linear in various embodiments. However, as long as the correlation itself is predictable, a particular etch step is representative of a particular depth within the substrate 100 during the DRIE. Further, in various embodiments, multiple correlation tables may be used depending on other factors such as chip density, wafer size, kerf dimensions, as examples.

Therefore, after determining the location of the notch 10 within the deep trench 30, the correlation table may be used to determine the location of the long etching step. The long etching step may then be introduced based on the number of completed etch/passivation cycles.

After the long etching step, a passivation step is used to passivate and protect the notch 10 during subsequent etching. The passivation step may be carried for the same amount of time as a prior passivation step. Alternatively, in some embodiments, a longer passivation time may be used to passivate the larger area exposed due to the long etching step. The series of etching and passivation is continued until a predetermined trench depth is obtained thereby forming islands 125 separated by deep trenches 30. In various embodiments, multiple long etching steps may be used.

Figure 4B:
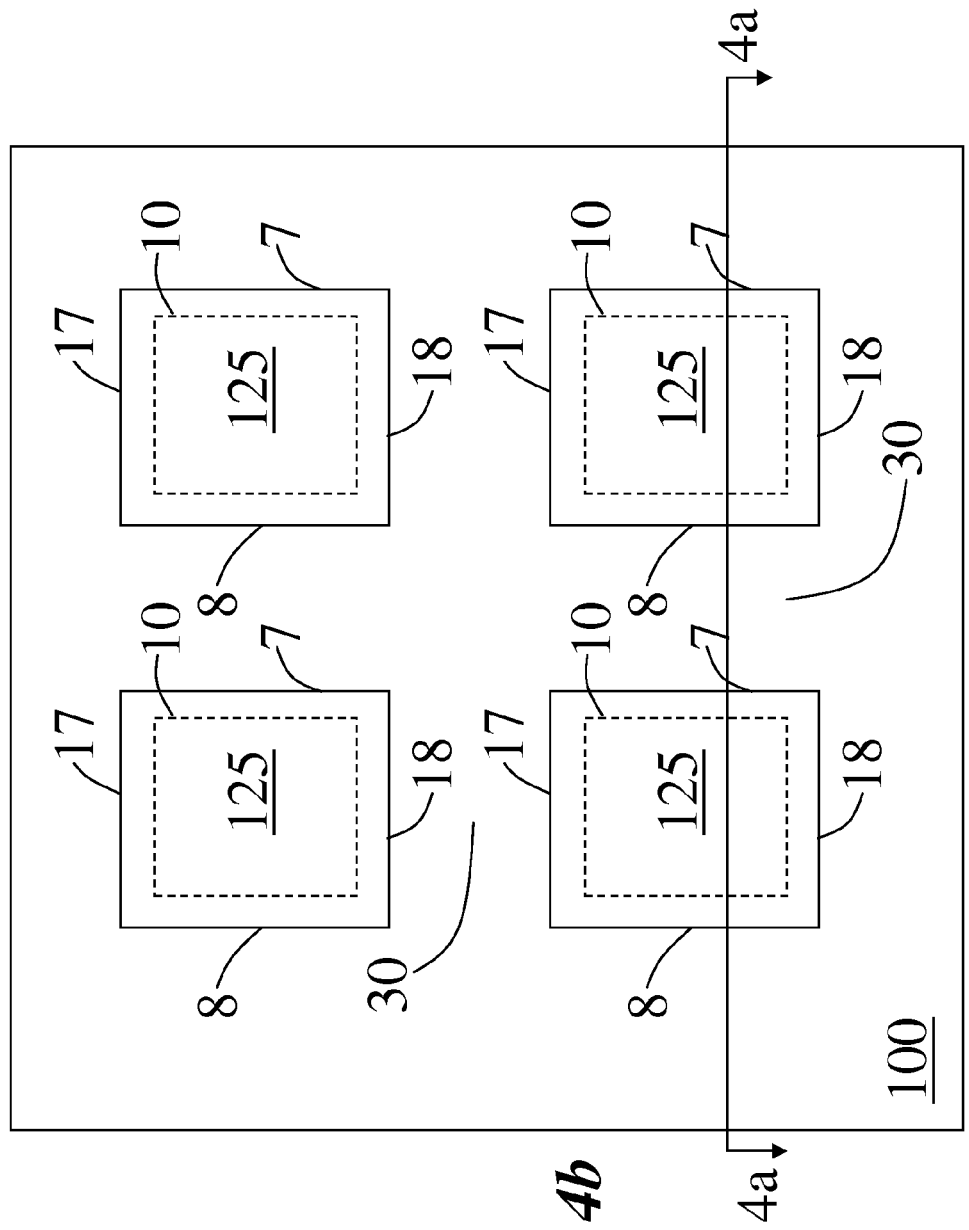

A top view of the structure is illustrated in FIG. 4*b* which illustrates a view along a plane having the line 4*b*-4*b* in FIG. 4*a*.

As illustrated in FIG. 4*b*, a third surface 7 and a fourth surface 8 together with a fifth surface 17 and a sixth surface 18 form the sides of the islands (sidewalls of the deep trenches 30). The notch 10 extends around the islands 125 along the third, the fourth, the fifth, and the sixth surfaces 7, 8, 17, and 18.

Figure 5:
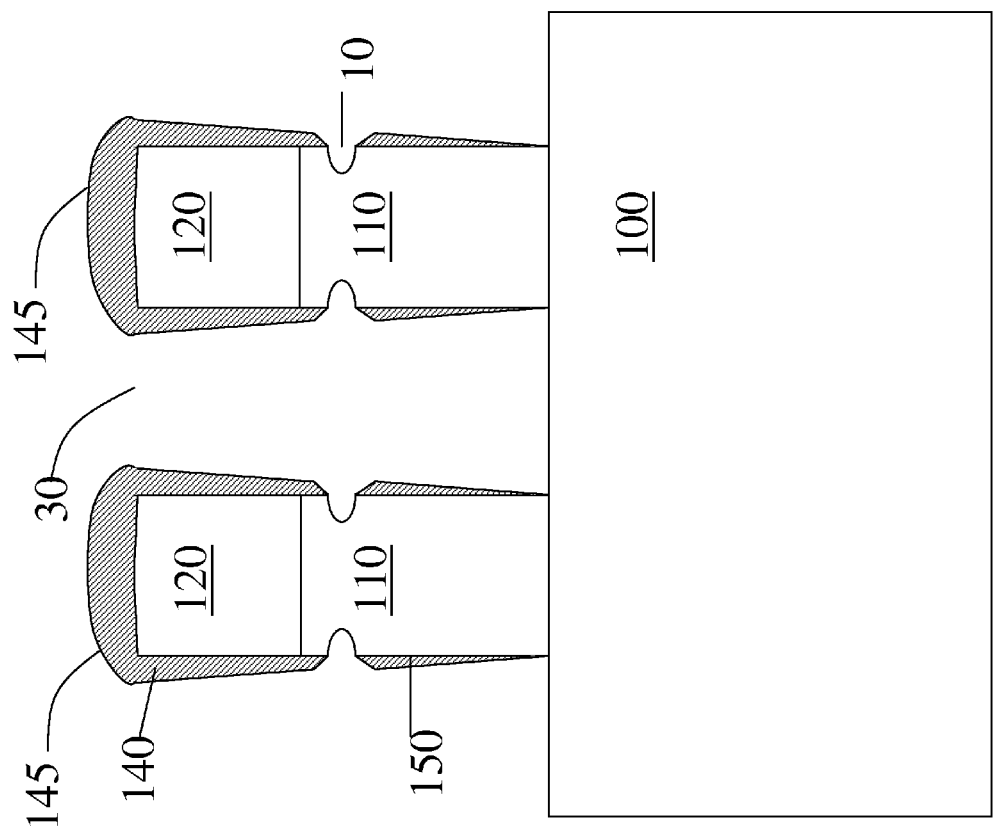

Referring next to FIG. 5, a first conductive layer 140 is deposited. The first conductive layer 140 is deposited using any conventional deposition processes. For example, in one embodiment, the first conductive layer 140 may be formed by sputtering metal atoms onto the islands 125.

Because the sidewalls of the islands are exposed, some metal is deposited on the sidewalls thereby forming a lower conductive layer 150 over the lower portion of the islands 125. However, the first conductive layer 140 and the lower conductive layer 150 are separated by the notch 10. The unique shape of the notch 10 protects the inner surfaces of the notch 10 from receiving any sputtered metal atoms. Therefore, the first conductive layer 140 is not shorted to the lower conductive layer 150.

In one embodiment, the first conductive layer 140 comprises titanium. In various embodiments, the first conductive layer 140 comprises tungsten, nickel, cobalt, platinum, silver, gold, copper, aluminum, including metal silicides.

Further conductive layers may be deposited to form the first electrode stack 145. For example, in one embodiment, the first electrode stack 145 may be formed by sputtering metal atoms onto the islands 125. In one embodiment, the first electrode stack 145 comprises a nickel layer deposited over the first conductive layer 140 comprising titanium. A silver layer is deposited over the nickel layer forming the first electrode stack 145. In alternative embodiments, the first electrode stack 145 may comprise Sn—Cu—Ag, Sn—Cu—Ag—Mn, Sn—Cu—Ag—Zn, or one or more combinations of Sb, Pb, Sn, Cu, Ag, Bi, In, Cd, and Au.

In some embodiments, deposition of various conductive layers may be performed in a single step. For example, in one embodiment, the first conductive layer 140 and the first electrode stack 145 may deposited in the same tool in a single process step.

Figure 6:
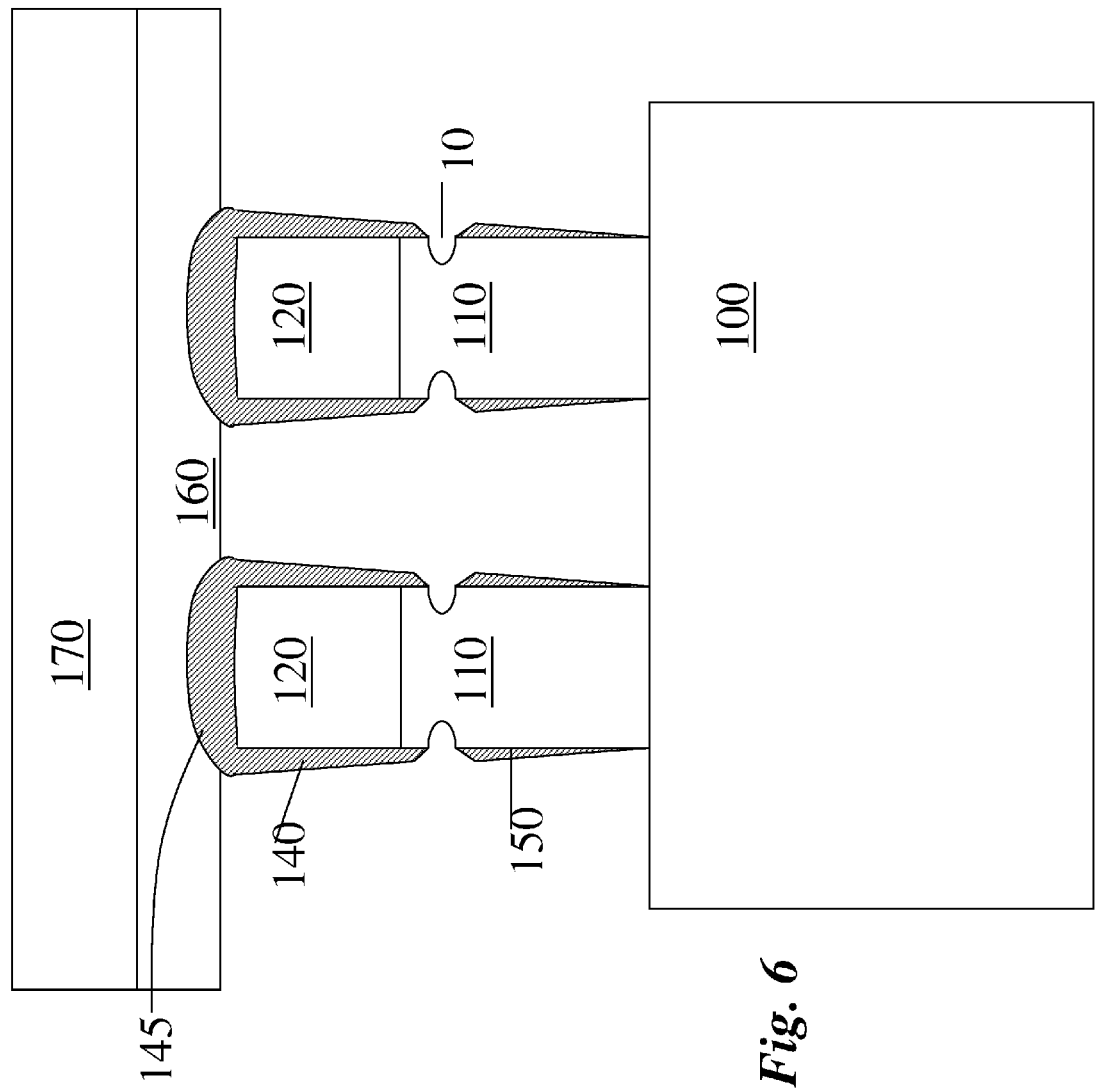

As next illustrated in FIG. 6, a foil 160 is deposited over the top surface of the islands 125 over the first electrode stack 145. The foil 160 may be any suitable material including a dicing or backgrind tape. The foil 160 is next attached to a carrier 170 or a mounting ring. The carrier 170 may be a rigid carrier in one embodiment to provide mechanical stability to the wafer during the thinning process. The carrier 170 is placed within a grinding tool.

Figure 7:
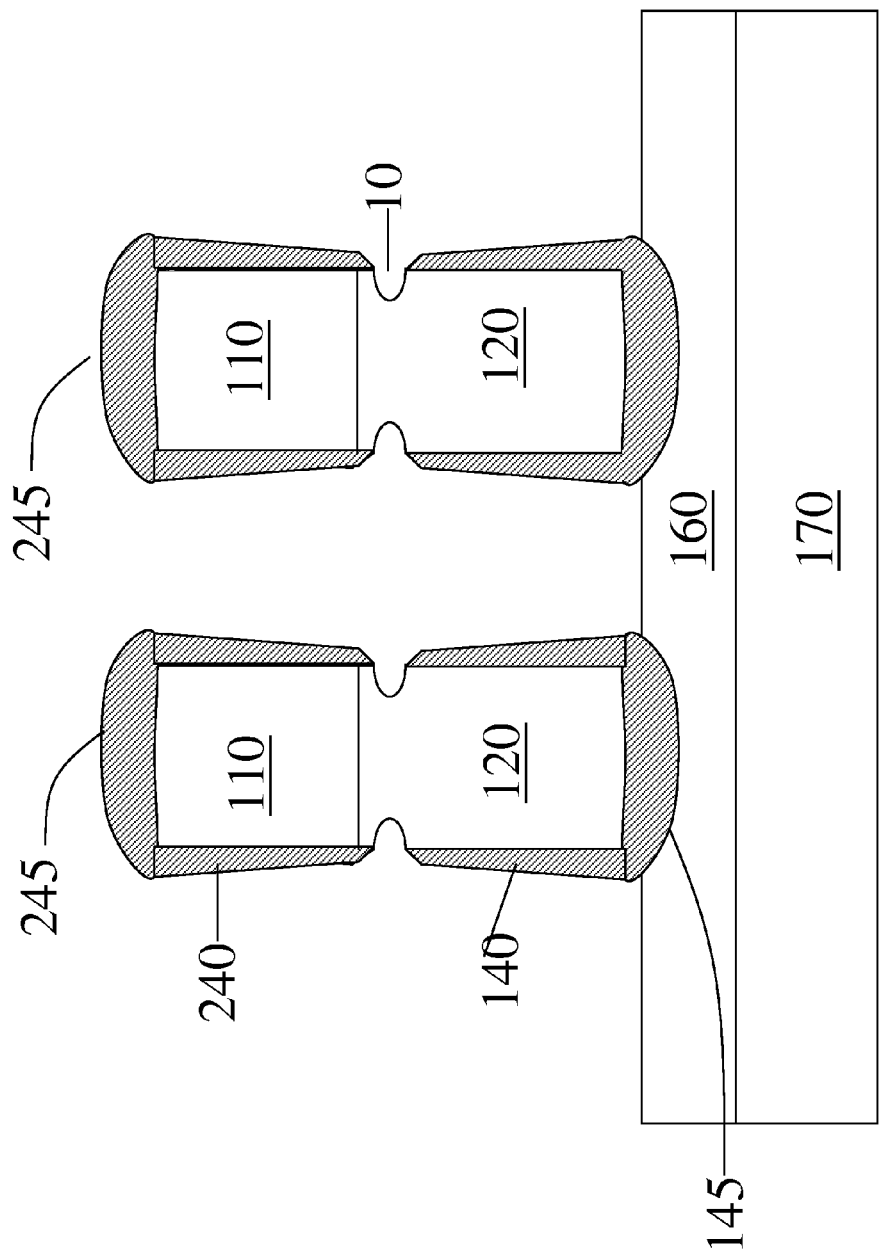

Referring next to FIG. 7, the substrate 100 is thinned from the back side to separate the islands 125. At this stage of fabrication, the islands 125 are held only by the foil 160 and the carrier 170.

A second electrode stack 245 is formed over the islands 125. In various embodiments, the second electrode stack 245 may be formed by a plurality of conductive layers. In one embodiment, the second electrode stack 245 comprises a Ti—Ni—Ag layer. In such an embodiment, a nickel layer is deposited over the second conductive layer 240 comprising titanium. Next, a silver layer is deposited over the nickel layer forming the second electrode stack 245. In alternative embodiments, the second electrode stack 245 may comprise Sn—Cu—Ag, Sn—Cu—Ag—Mn, Sn—Cu—Ag—Zn, or one or more combinations of Sb, Pb, Sn, Cu, Ag, Bi, In, Cd, and Au.

In various embodiments, the second electrode stack 245 comprises at least one second conductive layer 240. The second conductive layer 240 is deposited over the exposed islands 125 as illustrated in FIG. 7. In various embodiments, the second conductive layer 240 is deposited using any conventional deposition processes. In one embodiment, the second conductive layer 240 may be formed by sputtering. As during the formation of the first conductive layer 140, any metal atoms deposited on the lower sidewall (over the first conductive layer 140) are electrically isolated from the second conductive layer 240. Rather, any layer formed over the first conductive layer 140 is isolated from the second conductive layer 240 by the notch 10. Therefore, embodiments of the invention ensure that the first electrode stack 145 is not coupled directly to the second electrode stack 245.

In one or more embodiments, the second conductive layer 240 may comprise the same material as the first conductive layer 140. In other embodiments, the second conductive layer 240 may comprise a different material than the first conductive layer 140. In various embodiments, the second conductive layer 240 comprises titanium, tungsten, nickel, cobalt, platinum, silver, gold, copper, and/or aluminum, including metal silicides.

The islands 125 are separated from the foil 160 and the carrier 170 thereby forming independent chips as illustrated in FIG. 1.

Figure 8:
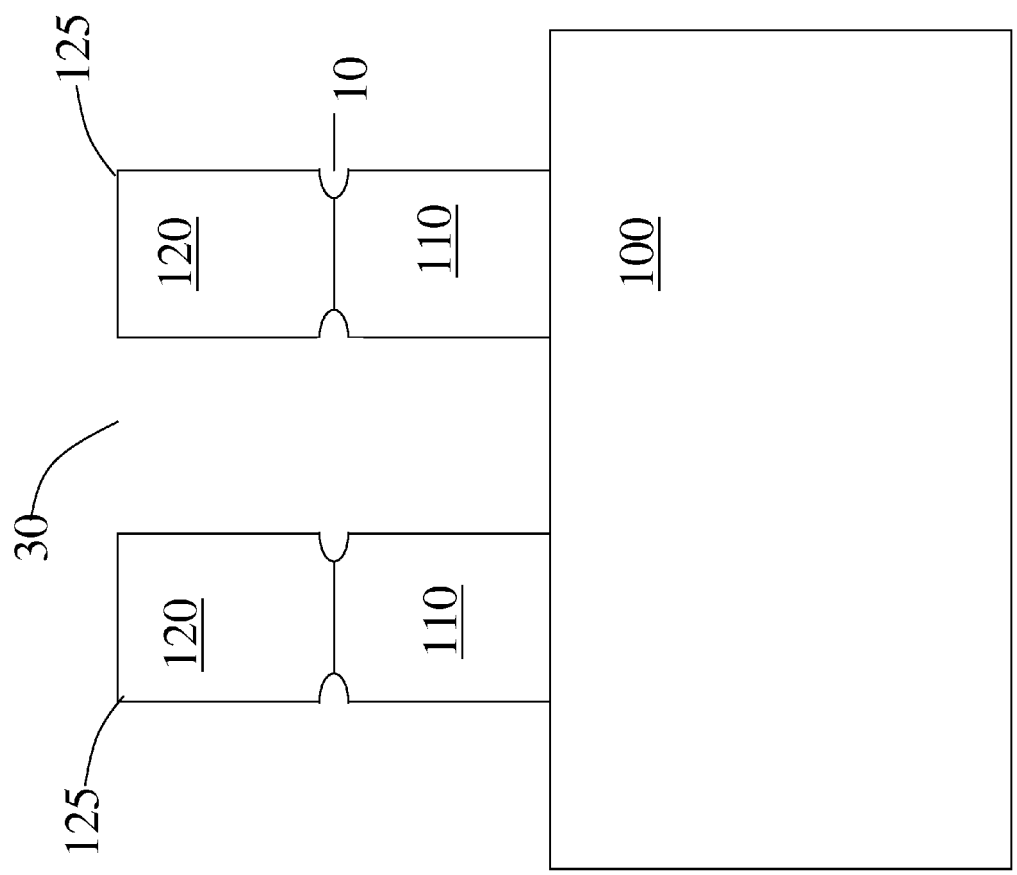
FIGS. 8-9 illustrate a structural embodiment and a method of making the structure in accordance with embodiments of the invention.
Figure 9:
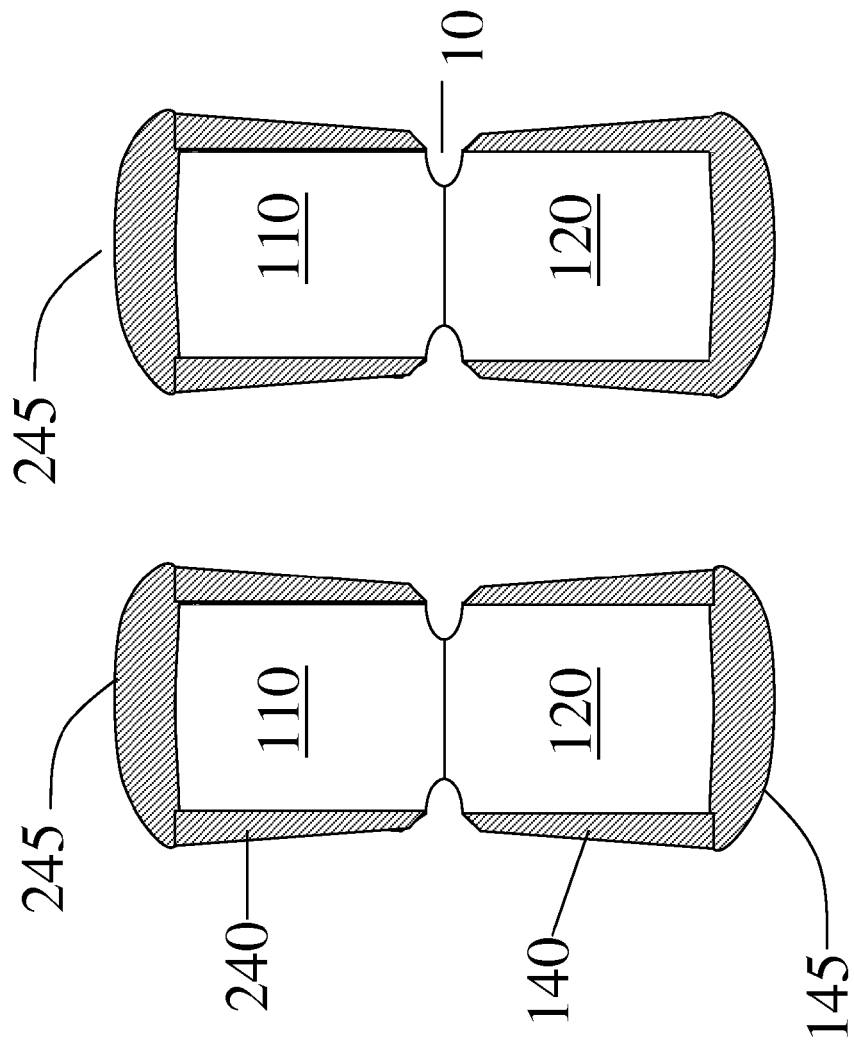

FIGS. 8-9 illustrates a structural embodiment and a method of making the structure in accordance with embodiments of the invention.

The embodiment is similar to the prior embodiment except that the depth of the notch 10 is carefully targeted to be at the p/n junction formed between a first doped region 110 and a second doped region 120. In one or more embodiments, this may be performed by using a correlation table, as described above, to select a particular cycle within the etching/passivation cycles to include the long etching step. The long etching step subsequently creates the notch 10 at the exact location of the junction between the first and the second doped regions 110 and 120 as illustrated in FIG. 8. FIG. 8 illustrates the device after forming the notch 10 followed by the formation of the deep trenches 30. The position of the notch 10 may be between the two doped regions although in other embodiments, the notch 10 may be placed in other locations.

Embodiments of the invention thereby ensure that the diode is not shorted to become a resistor. FIG. 9 illustrates independent chips having a notch 10, which overlaps with the location of the p/n junction between the first and the second doped regions 110 and 120.

Figure 10:
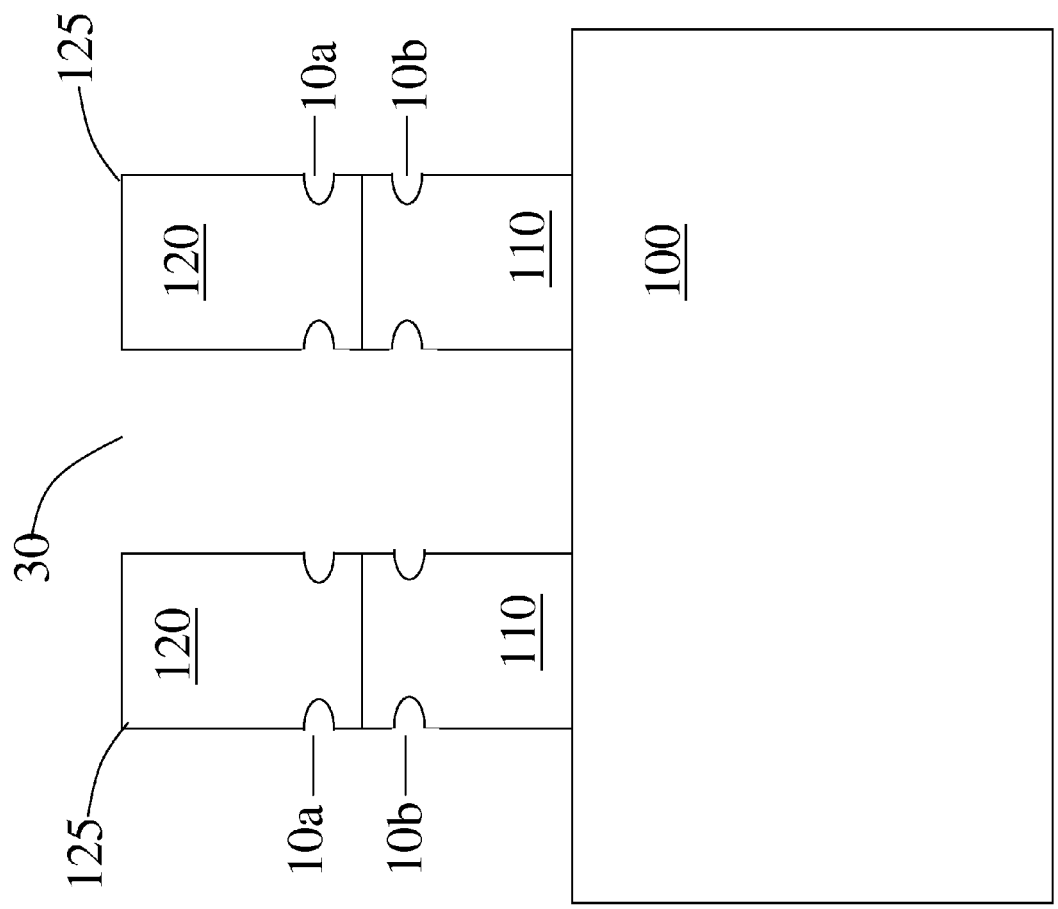
FIGS. 10-11 illustrate a structural embodiment and a method of making a structure having at least two notches, in accordance with an embodiment of the invention.
Figure 11:
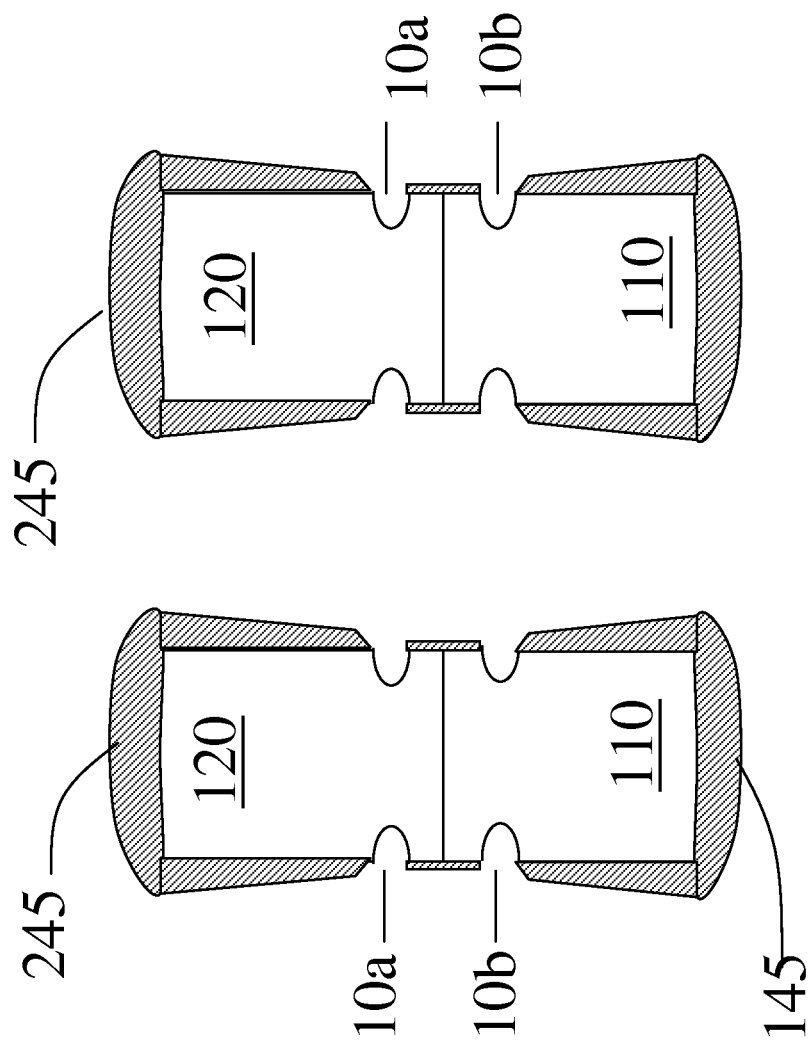

FIGS. 10-11 illustrates a structural embodiment and a method of making a structure having at least two notches, in accordance with an embodiment of the invention.

FIG. 10 illustrates an embodiment having a first notch 10a and a second notch 10b around the islands 125. The additional notches provide further protection against shorting between the frontside and backside metallization. FIG. 11 illustrates independent chips after fabrication showing that the front side metallization (e.g., first electrode stack 145) and backside metallization (e.g., second electrode stack 245) are not shorted. In various embodiments, more notches may be formed.

Figure 12:
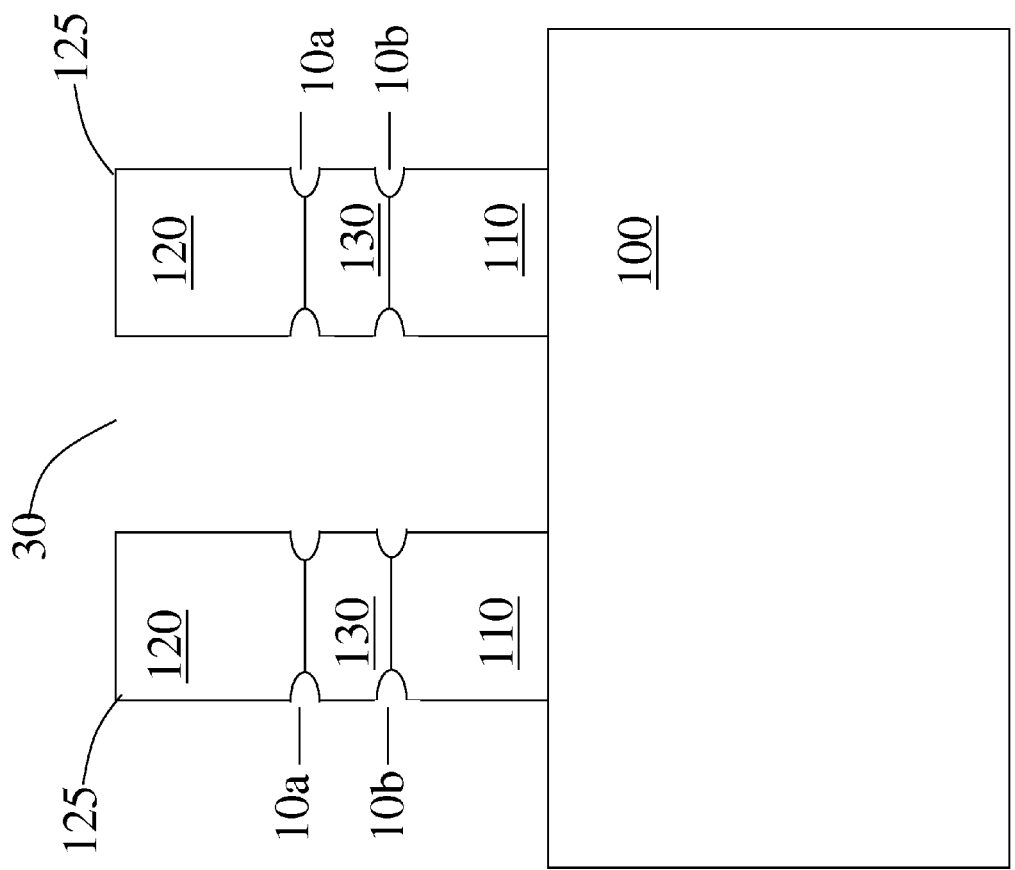
FIGS. 12-13 illustrate another structural embodiment and a method of making a structure having at least two notches, in accordance with an embodiment of the invention.
Figure 13:
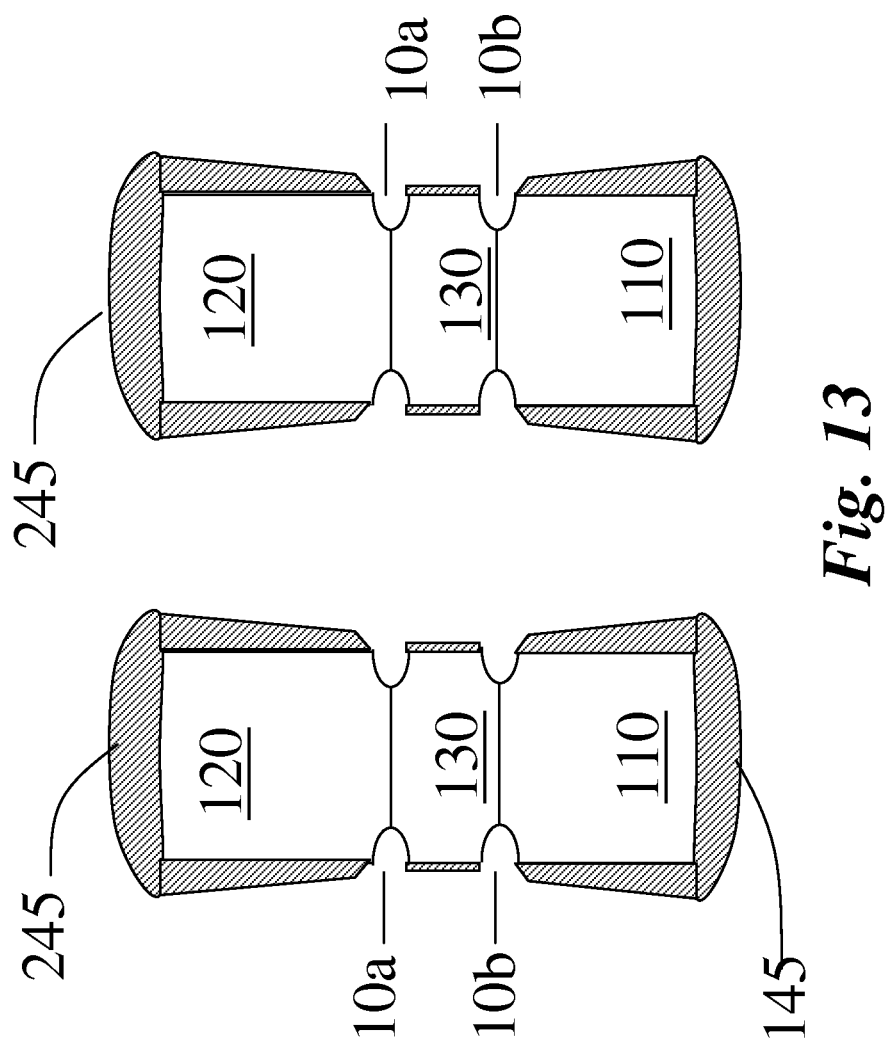

FIGS. 12-13 illustrates another structural embodiment and a method of making a structure having at least two notches, in accordance with an embodiment of the invention.

Referring to FIG. 12, the semiconductor device being fabricated illustrated includes a first doped region 110, a second doped region 120 having conductivity opposite to the first doped region 110. A third doped region 130 is formed between the first and the second doped regions 110 and 120.

In accordance with embodiments, first and second notches 10a and 10b are formed such that any conductive layer formed subsequently is not directly coupled to the third doped region 130. For example, as illustrated in FIG. 13, the first electrode stack 145 contacting the first doped region 110 is separated from third doped region 130 by the second notch 10b. Similarly, the second electrode stack 245 contacting the second doped region 120 is separated from the third doped region 130 by the second notch 10a.

In one embodiment, FIGS. 12-13 illustrate a PIN diode. In such an embodiment, the third doped region 130 is an intrinsic region. In alternative embodiments, FIGS. 12-13 illustrate bipolar transistors. In such embodiments, the first and the second doped regions 110 and 130 may have the same doping type with the third doped region 130 having an opposite conductivity type thereby forming a base region of bipolar transistors. Additional contacts may be formed on the sidewalls thereby contacting the third doped region 130. In such embodiments, the first and the second notches 10*a* and 10*b* prevent shorting between the base and the collector regions and between the base and emitter regions.

Figure 14:
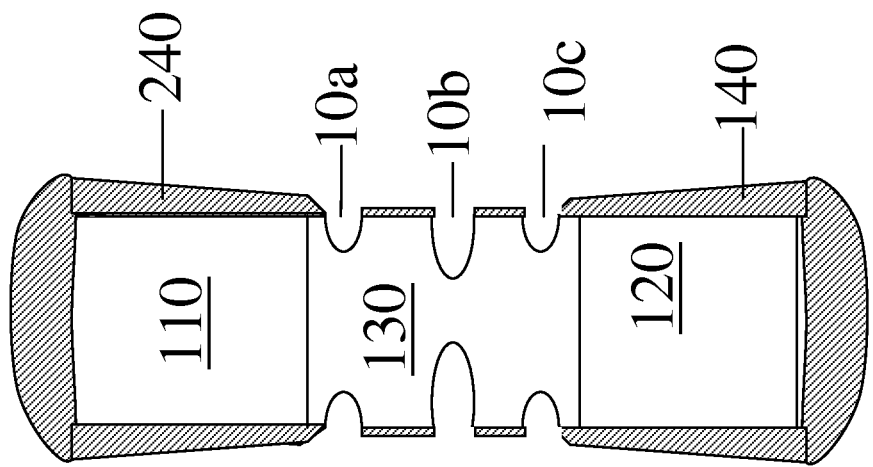
FIG. 14 illustrates a cross sectional view of a chip in accordance with an embodiment of the invention.

FIG. 14 illustrates a cross sectional view of a chip in accordance with an embodiment of the invention.

FIG. 14 illustrates a semiconductor device having a first doped region 110, a second doped region 120, and a third doped region 130. In various embodiments, at least three notches 10 (a first notch 10*a*, a second notch 10*b*, and a third notch 10*c*) are used to separate the front side metallization (e.g., first electrode stack 145) from the backside metallization (e.g., second electrode stack 245).

In various embodiments, the first notch 10*a*, the second notch 10*b*, and the third notch 10*c* may comprise different dimensions. In one embodiment, the second notch 10*b* is deeper than the first and the third notches 10*a* and 10*c* (as illustrated in FIG. 14).

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
a first doped region disposed adjacent a top surface of a substrate;
a first electrode disposed on the top surface;
a second doped region disposed adjacent a bottom surface of the substrate, wherein the bottom surface is opposite to the top surface;
a second electrode disposed on the bottom surface; and
a first notch disposed around sidewalls of the substrate in a first region, wherein the substrate has a first dimension at the top surface, wherein the substrate has a second dimension in the first region, and wherein the second dimension is smaller than the first dimension.

2. The semiconductor device of claim 1, wherein the first region overlays a junction between the first and the second doped regions, and wherein a conductivity type of the first doped region is opposite to the second doped region.

3. The semiconductor device of claim 1, further comprising a second notch disposed around the sidewalls of the substrate in a second region, the second region disposed between the first region and the top surface, wherein the substrate has a third dimension in the second region, the third dimension being smaller than the first dimension, wherein the substrate has the first dimension in a region between the first and the second regions.

4. The semiconductor device of claim 3, wherein the first region is adjacent a junction between a first doped region and an intrinsic region, wherein the second region is adjacent a junction between a second doped region and the intrinsic region.

5. The semiconductor device of claim 3, wherein the first region is adjacent a first p/n junction between the first doped region and a third doped region, and wherein the second region is adjacent a second p/n junction between the second doped region and the third doped region.

6. A semiconductor device comprising:
a first electrode on a top surface of a substrate; and
a second electrode on a bottom surface of the substrate, wherein the bottom surface is opposite to the top surface along a first direction,
wherein the substrate has a first dimension along a second direction at the top surface, wherein the substrate has a second dimension along the second direction at the bottom surface, wherein the substrate has a third dimension along the second direction in a first region between the top and the bottom surfaces, wherein the first dimension is about the same as the second dimension, wherein the third dimension is smaller than the first dimension, and wherein the second direction is perpendicular to the first direction.

7. The semiconductor device of claim 6, wherein the first region is adjacent a p/n junction disposed within the substrate.

8. The semiconductor device of claim 6, wherein a second region is disposed in the substrate between the first region and the top surface, and wherein the substrate has a fourth dimension along the second direction in the second region, the fourth dimension being smaller than the first dimension.

9. The semiconductor device of claim 8, wherein the first region is adjacent a junction between a first doped region and an intrinsic region, wherein the second region is adjacent a junction between a second doped region and the intrinsic region.

10. The semiconductor device of claim 8, wherein the first region is adjacent a first p/n junction disposed within the substrate, and wherein the second region is adjacent a second p/n junction disposed within the substrate.

11. The semiconductor device of claim 8, further comprising a third region disposed between the first region and the bottom surface, wherein the substrate has a fifth dimension in the third region, the fifth dimension being smaller than the first dimension.

12. The semiconductor device of claim 11, wherein the first region is adjacent a first p/n junction disposed within the substrate, and wherein the second region is adjacent a second p/n junction disposed within the substrate.

13. A semiconductor device comprising:
a first conductive electrode layer on a top surface of a substrate;
a second conductive electrode layer on a bottom surface of the substrate, wherein the bottom surface is opposite to the top surface along a first direction; and
a first notch disposed around sidewalls of the substrate in a first region.

14. The semiconductor device of claim 13, wherein the first region comprises a p/n junction.

15. The semiconductor device of claim 13, wherein the substrate has a first dimension along a second direction at the top surface, wherein the substrate has a second dimension along the second direction at the bottom surface, wherein the substrate has a third dimension along a second direction at the first notch, and wherein the third dimension is smaller than the first dimension, and wherein the second direction is perpendicular to the first direction.

16. The semiconductor device of claim 15, wherein the second dimension is about the same as the first dimension.

17. The semiconductor device of claim 15, wherein the third dimension is smaller than the second dimension.

18. The semiconductor device of claim 13, further comprising a second notch disposed around the sidewalls of the substrate in a second region, the second region disposed between the first region and the top surface.

19. The semiconductor device of claim 18, wherein the substrate has a first dimension along a second direction at the top surface, wherein the substrate has a second dimension along the second direction at the bottom surface, wherein the substrate has a third dimension along a second direction at the first notch, wherein the substrate has a fourth dimension along a second direction at the second notch, wherein the third dimension is smaller than the first dimension, wherein the fourth dimension is smaller than the first dimension, and wherein the second direction is perpendicular to the first direction.

20. The semiconductor device of claim 19, wherein the substrate has the first dimension in a region between the first and the second regions.

21. The semiconductor device of claim 18, wherein the first region comprises a first p/n junction and the second region comprises a second p/n junction.

* * * * *